United States Patent
Saika

(10) Patent No.: US 6,573,596 B2
(45) Date of Patent: Jun. 3, 2003

(54) NON-RECTANGULAR THERMO MODULE WAFER COOLING DEVICE USING THE SAME

(75) Inventor: Masao Saika, Yawara-mura (JP)

(73) Assignee: SMC Corporation, Tokyo (JP)

( * ) Notice: Subject to any disclaimer, the term of this patent is extended or adjusted under 35 U.S.C. 154(b) by 0 days.

(21) Appl. No.: 09/998,634

(22) Filed: Dec. 3, 2001

(65) Prior Publication Data

US 2002/0074646 A1 Jun. 20, 2002

(30) Foreign Application Priority Data

Dec. 15, 2000 (JP) ..................................... 2000-382606

(51) Int. Cl.$^7$ ............................................. H01L 23/34
(52) U.S. Cl. .................. 257/712; 257/930; 257/717; 257/620; 257/688; 257/618
(58) Field of Search ................................ 257/717, 712, 257/720, 688, 689, 620, 618, 930

(56) References Cited

U.S. PATENT DOCUMENTS

| | | | |
|---|---|---|---|
| 5,168,339 A | * 12/1992 | Yokotani et al. | 257/64 |
| 5,216,887 A | * 6/1993 | Kadotani et al. | 62/3.2 |
| 5,430,322 A | * 7/1995 | Koyanagi et al. | 136/203 |
| 5,439,528 A | * 8/1995 | Miller | 136/200 |
| 5,441,576 A | * 8/1995 | Bierschenk et al. | 136/203 |
| 5,892,656 A | * 4/1999 | Bass | 136/203 |
| 5,950,067 A | * 9/1999 | Maegawa et al. | 257/62 |
| 5,952,728 A | * 9/1999 | Imanishi et al. | 136/224 |
| 6,111,513 A | * 8/2000 | Goto et al. | 257/712 |
| 6,306,673 B1 | * 10/2001 | Imanishi et al. | 136/201 |
| 6,347,661 B2 | * 2/2002 | Miki | 165/133 |
| 6,400,013 B1 | * 6/2002 | Tsuzaki et al. | 257/712 |
| 2002/0005522 A1 | * 1/2002 | Miyokawa et al. | 257/79 |
| 2002/0024154 A1 | * 2/2002 | Hara et al. | 257/930 |

* cited by examiner

Primary Examiner—Nathan J. Flynn
Assistant Examiner—Pershelle Greene
(74) Attorney, Agent, or Firm—Oblon, Spivak, McClelland, Maier & Neustadt, P.C.

(57) ABSTRACT

A non-rectangular thermo module is formed by disposing a plurality of Peltier devices between a pair of heat radiating plates, wherein the heat radiating plate has a circular or straight outer peripheral contour portion and inner peripheral contour portion and right/left side edge contour portions connecting the outer peripheral contour portion and the inner peripheral contour portion and the outer peripheral contour portion is formed longer than the inner peripheral contour portion while the right/left side edge contour portions contain first straight lines which are not parallel and inclined toward the inner peripheral contour portion such that they narrow gradually, the first straight lines being provided at least in part of the right/left side edge contour portions.

12 Claims, 7 Drawing Sheets

FIG. 1
FIG. 2
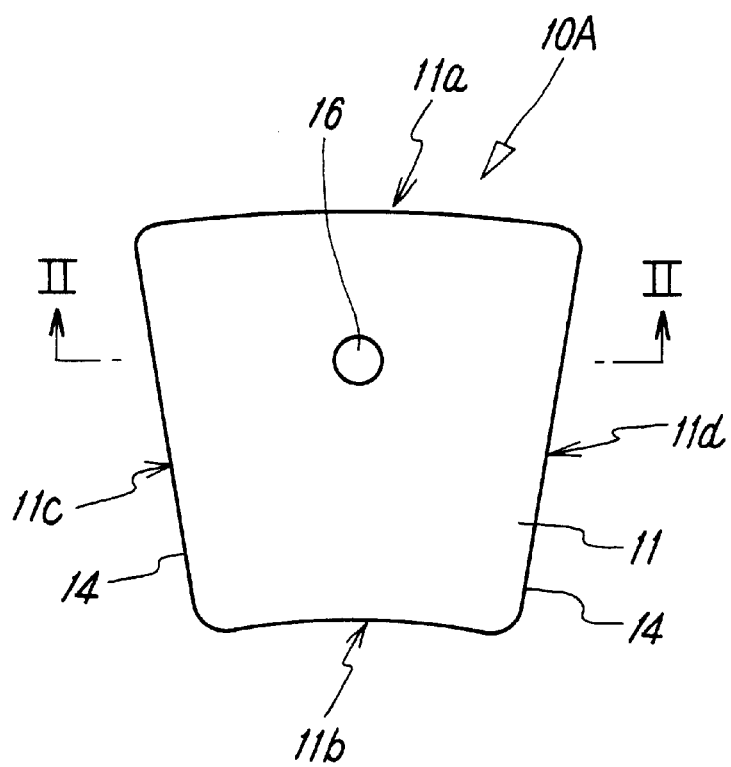
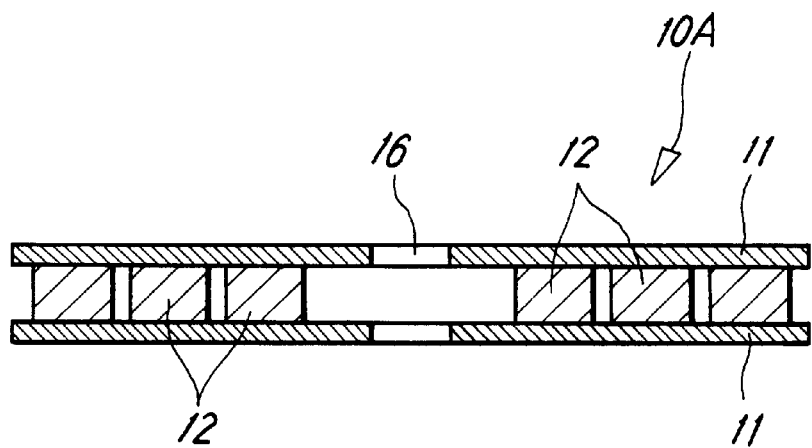

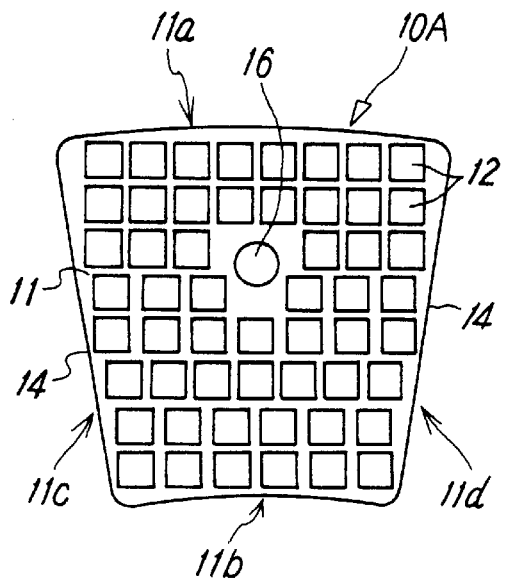
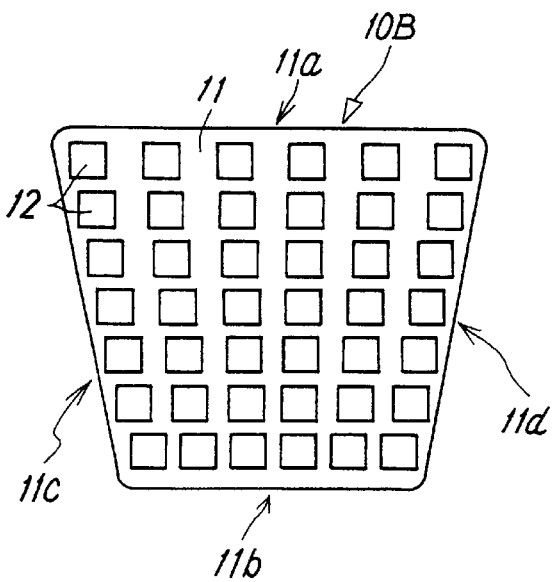
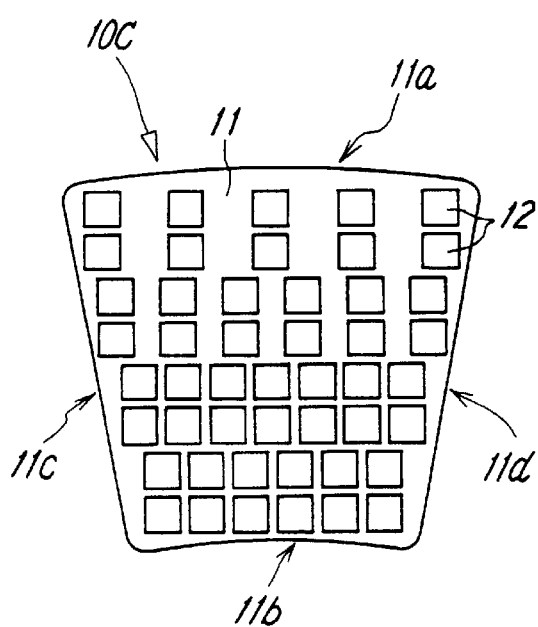
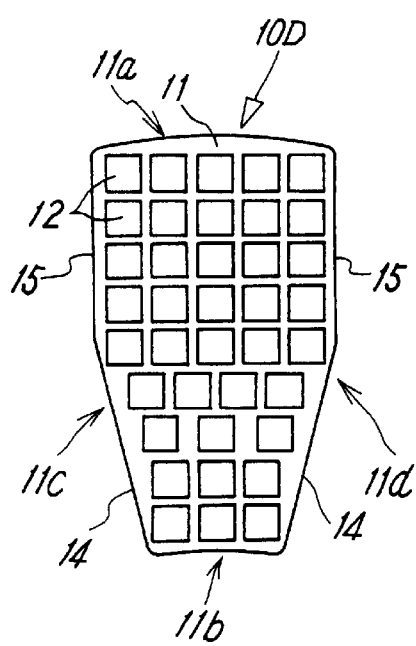

NON-RECTANGULAR THERMO MODULE WAFER COOLING DEVICE USING THE SAME

TECHNICAL FIELD

The present invention relates to a non-rectangular thermo module for use in cooling a semiconductor wafer and a cooling device formed using the same.

PRIOR ART

In a cooling device for cooling a semiconductor wafer, generally, as show in FIGS. 12 and 13, a plurality of thermo modules 3 are disposed between a circular cooling plate 1 for cooling a wafer W and a heat radiating blocks 2 for radiating heat to the outside and fastened together with a plurality of screws 4. A plurality of lifter pins 5 supporting the wafer W pass through the heat radiating blocks 2 and the cooling plate 1, such that they are protruded from a top face of the cooling plate 1 movably in the vertical direction. Reference numeral 6 denotes a refrigerant flow path.

In this kind of a conventional cooling device, as shown in FIG. 13, the aforementioned thermo modules 3 are cubic or rectangular and the thermo modules 3 are disposed in a circular plane of a cooling plate 1. Thus, the thermo modules 3 are difficult to dispose without a gap, so that much dead space exists. As a result, a temperature gradient between a place where thermo module 3 exists and a place where no thermo module exists cannot be avoided, thereby making it difficult to cool the wafer uniformly and inducing a poor cooling efficiency. Further, the thermo module 3 cannot be installed at a tightening position of the screw and an installation position of a lifter pin 5 so as to avoid them, so that a portion where the thermo modules are not installed occupies a large area of the cooling plate. The aforementioned temperature gradient appears more remarkably if the cooling plate 1 is thinned to reduce the weight, heat capacity thereof and the like.

Although the cooling plate 1 is desired to be thinned to reduce its heat capacity for reduction of cooling time, it is more likely to be deformed when it is tightened with the screw 4 accompanied by such thinning, so that the flatness drops.

Unless each thermo module 3 is disposed accurately at a predetermined position of the cooling plate 1 when the cooling plate 1 is combined with the thermo module 3, an unbalanced temperature gradient occurs. For the reason, concave portions for fixing the thermo modules are provided in the cooling plate or the thermo modules are fixed with a spacer. Even if such countermeasure is taken, the thermo module may ride over the surrounding of the concave portion or spacer, so that an installation failure may occur. Therefore, it is desirable that the thermo modules are disposed accurately without causing the installation failure.

DISCLOSURE OF THE INVENTION

A technical object of the present invention is to provide a thermo module which can be densely installed in a circular plane of a disc type cooling plate in a cooling device and be effective for improvement of its cooling capacity and reduction of a temperature gradient.

Another technical object of the present invention is to provide a cooling device intended to improve the cooling capacity and reduce the temperature gradient using the aforementioned thermo module.

To achieve the above-described object, according to the present invention, there is provided a non-rectangular thermo module formed by disposing a plurality of Peltier devices between a pair of opposing heat radiating plates, wherein the heat radiating plate has a circular or straight outer peripheral contour portion and inner peripheral contour position and right/left side contour portions connecting the outer peripheral contour portion and the inner peripheral contour portion and the outer peripheral contour portion is formed so as to be longer than the inner peripheral contour portion while the right/left side edge contour portions contain first straight lines which are not parallel and inclined toward the inner peripheral contour portion such that they narrow gradually, the first straight lines being provided at least in part of the right/left side edge contour portions.

Although the right/left side edge contour portions of the heat radiating plate in the aforementioned thermo module may be formed entirely of the first straight lines, its portion which is on the side of the inner peripheral contour portion may be formed of the first straight line while its portion which is on the side of the outer peripheral contour portion may be formed of second straight lines which are parallel to each other.

Further, a plurality of Peltier devices may be disposed such that the installation density thereof has a gradient from the inner peripheral contour portion of the heat radiating plate toward the outer peripheral contour portion.

Further, the thermo module may include a through hole which passes through the pair of the heat radiating plates.

According to the present invention, there is provided a wafer cooling device wherein a plurality of the thermo modules having the above-described structure are disposed coaxially between a circular cooling plate for cooling the wafer and a heat radiating block for radiating heat to the outside such that the first straight lines of adjacent thermo modules are parallel and adjacent to each other.

In the wafer cooling device, thermo modules located on an inner disc and thermo modules located on an outer disc each may have a different shape and dimensions from each other.

Further, in the present invention, preferably, the cooling plate, the thermo modules and the heat radiating block are fastened to each other with screws passing through each of the thermo modules at an installation position of at least part of the thermo modules.

Preferably, adjacent thermo modules disposed in a circular shape are connected to each other with conductive wire successively so that the thermo modules are maintained in a necessary installation pattern by the conductive wire.

BRIEF DESCRIPTION OF THE DRAWINGS

FIG. 1 is a plan view showing a first embodiment of a thermo module according to the present invention;

FIG. 2 is a sectional view taken along line II—II of FIG. 1;

FIG. 3 is a plan view showing an example of an arrangement of Peltier devices in the thermo module of FIG. 1;

FIG. 4 is a plan view showing an example of an arrangement of Peltier devices in the thermo module according to a second embodiment of the present invention;

FIG. 5 is a plan view showing an example of an arrangement of Peltier devices in the thermo module according to the second embodiment of the present invention;

FIG. 6 is a plan view showing an example of arrangement of Peltier devices in the thermo module according to the second embodiment of the present invention;

DESCRIPTION OF THE PREFERRED EMBODIMENTS

Figure 7:
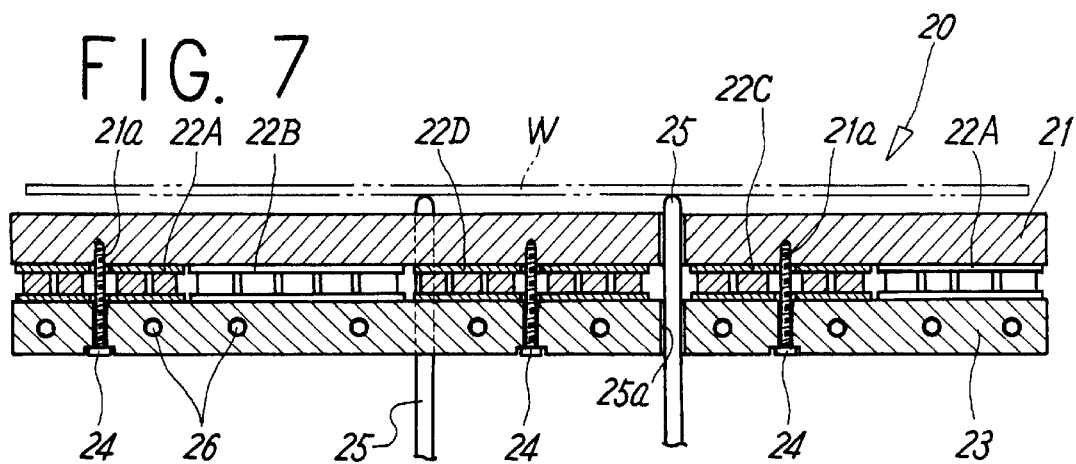
FIG. 7 is a sectional view showing schematically the first embodiment of the cooling device according to the present invention, taken along line VII—VII of FIG. 8.

FIGS. 1–3 show the first embodiment of the non-rectangular thermo module according to the present invention. In this thermo module 10A, a plurality of Peltier devices 12 are disposed between a pair of heat radiating plates 11 and 11, densely in a predetermined pattern and with substantially equal density. The aforementioned heat radiating plate 11 is formed of a ceramics having an excellent heat conductivity, including circular outer peripheral contour potion 11a and inner peripheral contour portion 11b, and right/left side edge contour portions 11c, 11d connecting the outer peripheral contour portion 11a with the inner peripheral contour portion 11b. The outer peripheral contour portion 11a is formed longer than the inner peripheral contour portion 11b and the right/left side edge contour portions 11c, 11d are formed with first straight lines 14, 14 non parallel to each other. These first straight lines 14, 14 are inclined from the outer peripheral contour portion 11a to the inner peripheral contour portion 11b such that they narrow gradually and further they are symmetrical.

Through holes 16 are formed in an intermediate position of the thermo module 10A such that they pass through the heat radiating plates 11, 11. This through hole 16 is used as a mounting hole for inserting a screw 24 when fastening a cooling plate 21, thermo modules 22A–22D and a heat radiating block 23 with screws 24 in a cooling device shown in FIG. 7. By forming this through hole in a slightly larger diameter than when used as the mounting hole, it may be used as an insertion hole for a lifter pin 25 for supporting the wafer W.

FIG. 4 shows a thermo module of a second embodiment with its upper heat radiating plate omitted. This thermo module 10B is different from the thermo module 10A of the first embodiment in that the outer peripheral contour portion 11a and the inner peripheral contour portion 11b of the heat radiating plate 11 are linear, the plurality of the Peltier devices 12 are disposed such that the density thereof has a gradient and there is no through hole 16. That is, in the thermo module 10B, the plurality of the Peltier devices 12 are disposed between a pair of the heat radiating plates 11 and 11, which are trapezoidal, such that an interval between the adjacent Peltier devices 12 and 12 is expanded gradually as they go from the inner peripheral contour portion 11b toward the outer peripheral contour portion 11a. Consequently, the installation density of the Peltier devices decreases gradually. The other structure is substantially the same as the first embodiment.

However, in the thermo module 10B of the second embodiment, the Peltier devices 12 may be disposed such that the installation density thereof is intensified as they go from the inner peripheral contour portion 11b to the outer peripheral contour portion 11a. Further, it is also permissible to provide the aforementioned through holes 16.

FIG. 5 shows a thermo module of a third embodiment with its upper heat radiating plate omitted. Although in this thermo module 10C, the installation density of the Peltier devices 12 is provided with a gradient like the thermo module 10B of the second embodiment, the difference from the second embodiment is that the installation pattern of the Peltier devices 12 is slightly different and the outer peripheral contour portion 11a and the inner peripheral contour portion 11b of the heat radiating plate 11 are circular. That is, the aforementioned Peltier devices 12 are disposed densely in a half portion on the side of the inner periphery of the heat radiating plate 11 while they are disposed sparsely in a half portion on the side of the outer periphery of the heat radiating plate 11. Meanwhile, the inner peripheral contour portion 11b of the heat radiating plate 11 may be in the form of a straight line. The other structure is substantially the same as the second embodiment.

FIG. 6 shows a thermo module of the fourth embodiment with its upper heat radiating plate omitted. The point in which this thermo module 10D is different from the aforementioned thermo module 10A of the first embodiment is that the side edge contour portions 11c, 11d on the right and left of the heat radiating plate 11 are not formed with only the first straight line portions 14, which are parallel to each other, but comprised of the first straight portions 14 located in a half portion on the side of the inner peripheral contour portion 11b and the second straight portions 15, which are located in a half portion on the side of the outer peripheral contour portion 11a and parallel to each other and that the heat radiating plate 11 has no through hole 16. The other structure is substantially the same as the first embodiment.

However, in the thermo module 10D of the fourth embodiment, the second straight portions 15 in the right and left side edge contour portions 11c, 11d may be non-parallel to each other. Although the second straight portions 15 are inclined in the same direction as the first straight portions 14, this inclination is milder than the first straight portion 14. At least any one of the inner peripheral contour portion 11b and the outer peripheral contour portion 11a may be formed in a straight line. Alternatively, the Peltier devices 12 may be disposed such that the installation density thereof changes as they go from the inner peripheral contour portion 11b toward the outer peripheral contour portion 11a. Further, it is also permissible to provide the through hole 16.

The thermo modules 10A–10D of the above-described respective embodiments may be so constructed that they have various shapes and dimensions depending on the purpose by changing the sizes of the inner peripheral contour portion 11b and the outer peripheral contour portion 11a and the lengths of the side edge contour portions 11c, 11d under each embodiment.

Figure 8:
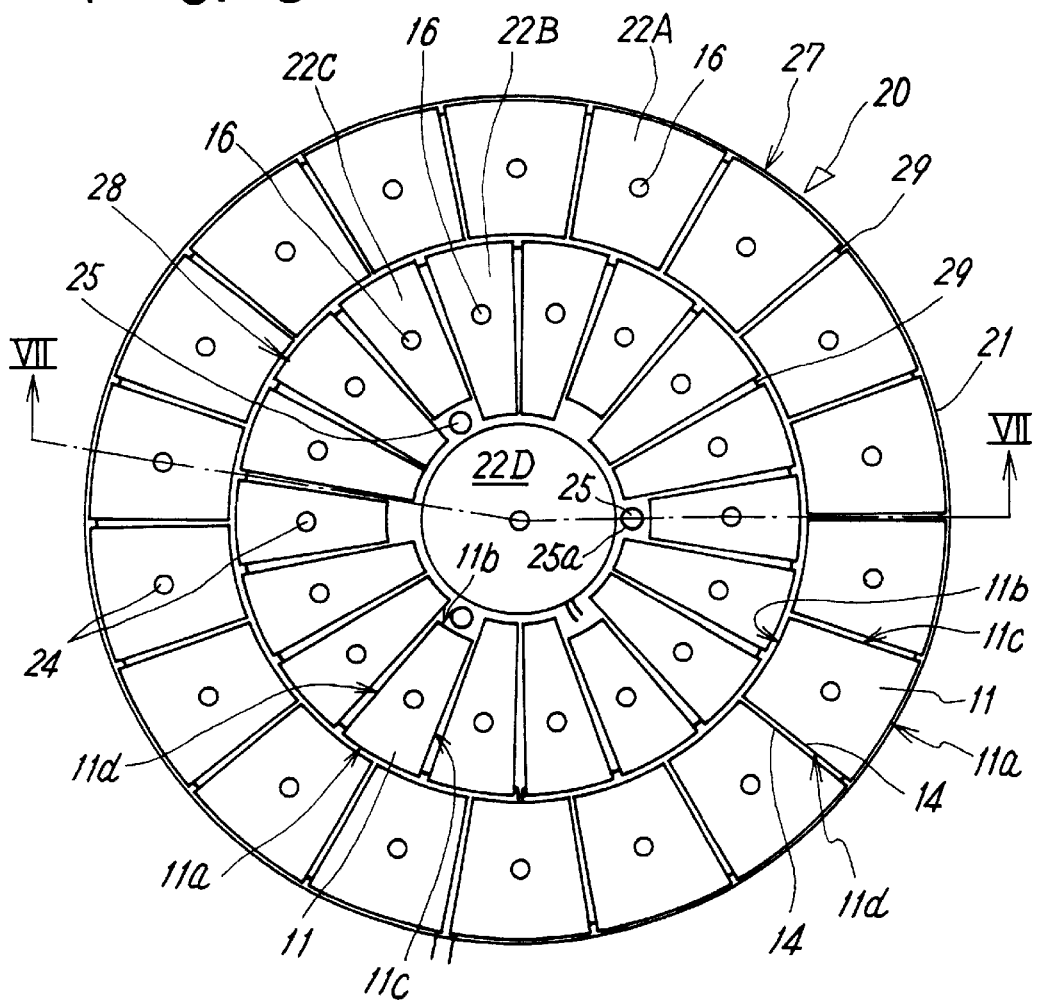
FIG. 8 is a plan view showing an example of the arrangement of the thermo module in the cooling device of the first embodiment.

FIGS. 7 and 8 show schematically a first embodiment of the wafer cooling device formed with the non-rectangular thermo modules described above. In this cooling device 20, a plurality of thermo modules 22A–22C each having a different shape are disposed coaxially between the circular cooling plate 21 for cooling the wafer W and the heat radiating block 23 for radiating heat to outside and a circular thermo module 22D is disposed in the center thereof. Reference numeral 26 denotes a refrigerant flow path provided internally the heat radiating block 23. This heat radiating block 23 may be formed of a single plate or a plurality of the plates or similar member as long as the heat radiating block 23 is capable of radiating heat from the aforementioned thermo modules 22A–22D to outside.

In the cooling device 20, the thermo module 22A located on the outside disc 27 is different in lateral width, length and the like from the thermo modules 22B, 22C located on an inside disc 28 and basically, these have a similar structure as shown in FIG. 3 or 5. That is, in these thermo modules 22A–22C, their upper/lower heat radiating plates 11 have circular outer peripheral contour portions 11a, inner peripheral contour portion 11b and right/left side edge contour portions 11c, 11d composed of the first straight portions which are non-parallel to each other. The plurality of the thermo modules 22A–22C are disposed in the shape of a ring in a condition that the inner peripheral contour portions 11b are directed toward the center of the cooling plate 21 while the outer peripheral contour portion 11a is directed to the side of the outer periphery of the cooling plate 21 and that the first straight portions 14 of the adjacent thermo modules 22A–22C are adjacent and parallel to each other. In this case, by disposing the thermo modules 22B, 22C located on the inner disc 28 at a position where the thermo modules 22A, 22A located on the outer disc 27 adjoin each other, a gap between the adjacent modules is set not to be straight through inside and outside.

Further, by connecting adjoining thermo modules 22A–22C located on the outer/inner discs 27, 28 at a position near the outer periphery with a short conductive wire 29, this conductive wire 29 is maintained entirely in a circular shape. Meanwhile, the inner disc 28 includes the thermo modules 22B, 22C whose lengths are different.

On the other hand, in the thermo module 22D located in the center, a plurality of Peltier devices are installed between the circular upper and lower heat radiating plates.

The respective thermo modules 22A–22C each have a through hole 16. By inserting the screws 24 into the through holes 16 at least, in part of the thermo modules from the side of the heat radiating block 23 and then drive them into screw holes 21a in a cooling plate, the cooling plate 21, the respective thermo modules 22A–22C and the heat radiating block 23 are coupled integrally. In this case, because high conductivity silicone grease or the like exists between the heat radiating plate of the respective thermo modules 22A–22C and the cooling plate 21 and the heat radiating block 23, adhesion is intensified.

A plurality of holes 25a, which pass through the cooling plate 21 and the heat radiating block 23, are disposed radially at equal central angles within a space between the inner peripheral end of the shorter thermo module 22C and the thermo module 22D located in the center of the thermo modules 22B, 22C situated on the inner disc. The lifter pine 25 is movably inserted in the vertical direction in each of these holes 25a.

Because in the aforementioned cooling device 20, the thermo modules 22A–22C are formed in a special rectangular shape, these thermo modules can be installed densely without gap in the circular plane of the cooling plate 21. Consequently, upon cooling the wafer W, no temperature gradient occurs in the cooling plate 21, thereby making it possible to cool the entire wafer W equally and effectively.

When the cooling plate 21, the thermo modules 22A–22C and the heat radiating block 23 are coupled with the screw 24, they are bolted with screws at the position of the thermo module, so that the thermo modules act as washers so as to prevent the cooling plate 21 from being deformed. Thus, even if the cooling plate 21 is thinned, its flatness can be maintained securely. Further, because the thermo modules are provided at the installation positions of the screws 24 also, there is no problem that such installation positions act as a dead space thereby causing a temperature gradient unlike in the conventional technology.

Of the respective thermo modules 22A–22C, those that the Peltier devices 12 are disposed uniformly and those that the Peltier devices 12 are disposed with a difference of density between the inner peripheral side and the outer peripheral side are used corresponding to the condition. For example, if the temperature of the cooling plate 21 upon cooling the wafer is higher than the ambient temperature, so that heat radiation from an outer peripheral face of the cooling plate 21 to ambient air is likely to occur, as shown in FIG. 5, on the outer disc 27, by using a thermo module in which the Peltier devices 12 are disposed such that the installation density thereof becomes more sparse as it goes from the inner peripheral contour portion 11b to the outer peripheral contour portion 11a, the temperature gradient between the outer periphery and the inner periphery of the cooling plate 21 can be eliminated effectively.

Although a positioning concave portion may be provided in a bottom face of the cooling plate 21 for each thermo module to engage, such a concave portion does not always have to be provided because the thermo modules arranged densely in a circular shape are connected with the conductive wire 29 successively so that they entirely maintain a circular relation. Meanwhile, although the thermo modules are coupled with the conductive wires 29 on each disc in the shown example, the disc may be divided into a plurality of sections and the thermo modules in each section may be coupled with the conductive wire. Alternatively, all the thermo modules may be coupled integrally with the conductive wire 29.

Figure 9:
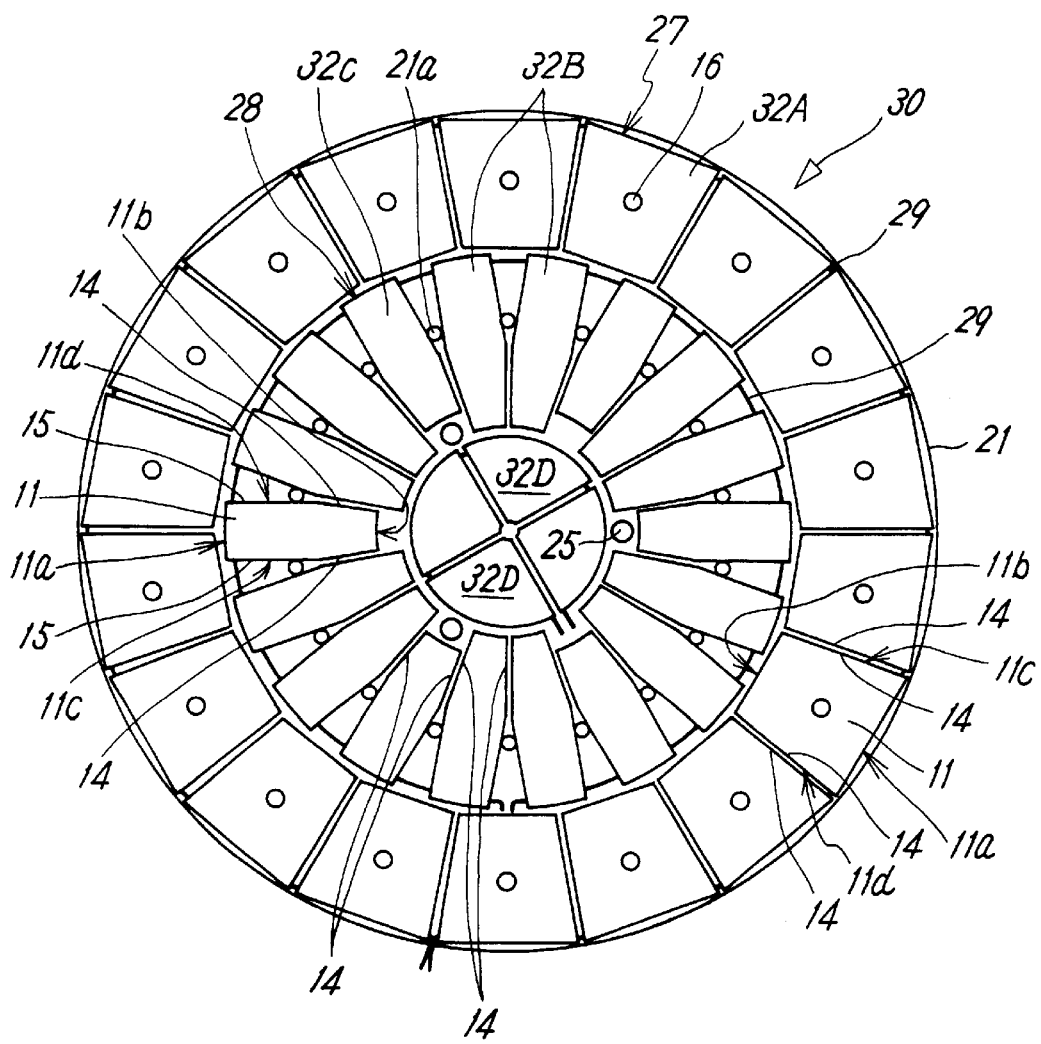
FIG. 9 is a plan view showing an example of the arrangement of the thermo module in the cooling device of the second embodiment.

FIG. 9 shows an example of arrangement of the thermo modules in a cooling device 30 of the second embodiment. In this second embodiment, a thermo module 32A located on an outer disc 27 has basically the same structure as the thermo module 10B shown in FIG. 4. That is, in this thermo module 32A, each of the upper and lower heat radiating plates 11 has a straight outer peripheral contour potion 11a and an inner peripheral contour portion 11b and right/left side edge contour portions 11c, 11d composed of non-parallel first straight lines 14. Further, through holes 16 are provided in the upper and lower heat radiating plates 11 and connection screw are inserted into part of the through holes 16.

On the other hand, the thermo modules 32B, 32C located on the inner disc 28 have basically a similar structure as the thermo module 10D shown in FIG. 6. In these thermo modules 32B, 32C, the outer peripheral contour portion 11a and the inner peripheral contour portion 11b of each of the upper/lower heat radiating plates 11 are formed in a circular shape and the right/ left side edge contour portions 11c, 11d are formed of the first straight lines 14 located in a half portion on the side of the inner peripheral contour portion 11b and the second straight lines 15, which are located in a half portion on the side of the outer peripheral contour portion 11a and parallel to each other. Then, the thermo modules are disposed in a circular shape such that the first straight lines 14, 14 of the adjacent thermo modules are parallel and adjacent to each other.

No through holes 16 are formed in the thermo modules 32B, 32C located on this inner disc 28 and therefore, no coupling screw is mounted at this thermo module position. However, instead, a screw is attached to the hole 21a in the cooling plate 21 in each gap between the second straight lines 15 and 15 of adjacent thermo modules.

Thermo modules 32D obtained by dividing a circle to four sections, are installed in the center of the cooling plate 21.

The structure other than described above of the second embodiment is substantially the same as the first embodiment.

Figure 10:
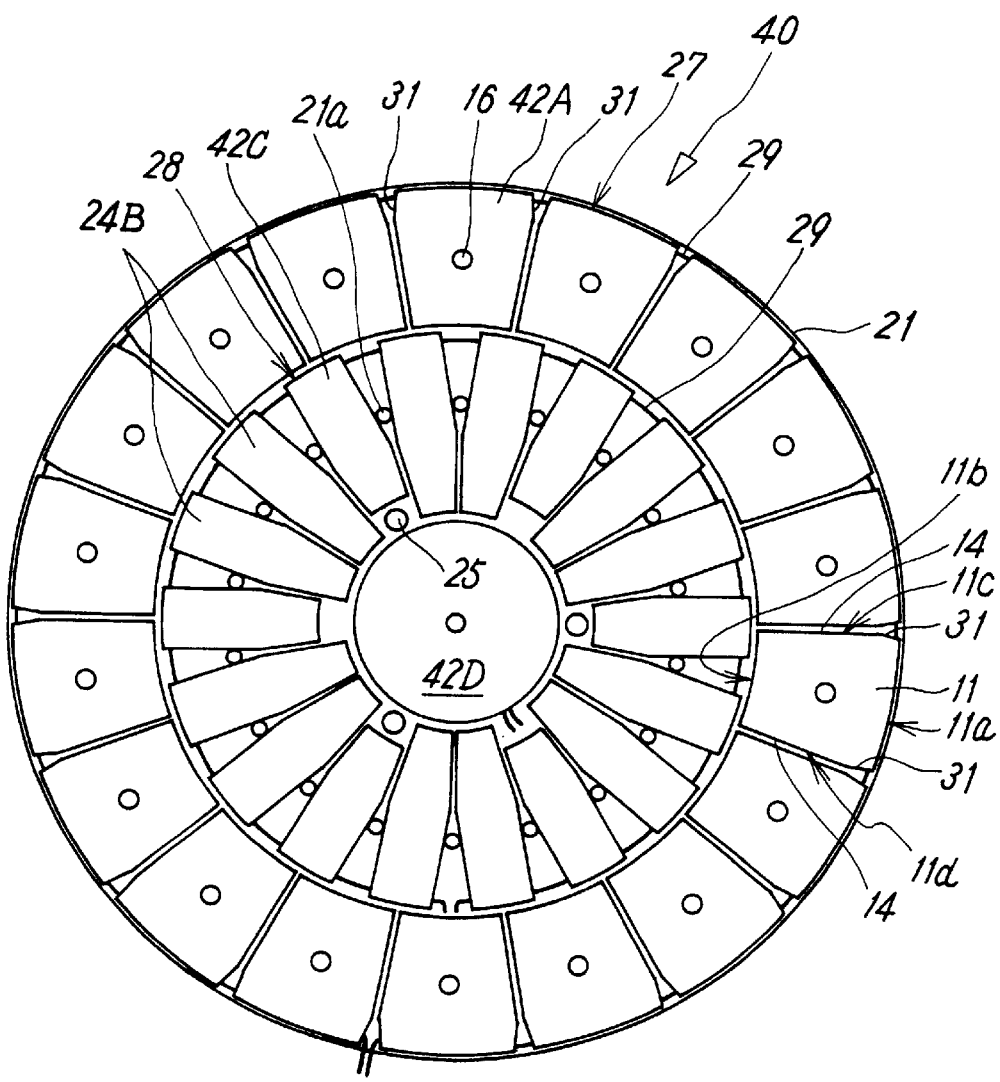
FIG. 10 is a plan view showing an example of the arrangement of the thermo module in the cooling device of the third embodiment.

FIG. 10 shows an example of the arrangement of the thermo modules in a cooling device 40 of the third embodiment. In the third embodiment, a thermo module 42A located on an outer disc 27 has substantially the same structure as the thermo modules 10A, 10C shown in FIGS. 3 and 5 respectively. That is, in this thermo module 42A, each of its upper and lower heat radiating plates 11 has a circular outer peripheral contour portion 11a and inner peripheral contour portion 11b and right/left side edge contour portions 11c, 11d composed of first straight lines 14, which are not parallel to each other. However, this is different from the thermo modules 10A, 10C in that a cutout portion 31 is formed at a position of each of the side edge contour portions 11c, 11d near its outer periphery in order to facilitate connection with the conductive wire 29. Further, a through hole 16 is provided in the upper/lower heat radiating plates 11 and coupling screws are inserted into at least part of the through holes 16.

On the other hand, the thermo modules 42B, 42C located on the inner disc 28 have the same structure as the second embodiment.

Meanwhile, a circular thermo module 42D is installed in the center of the cooling plate 21.

Figure 11:
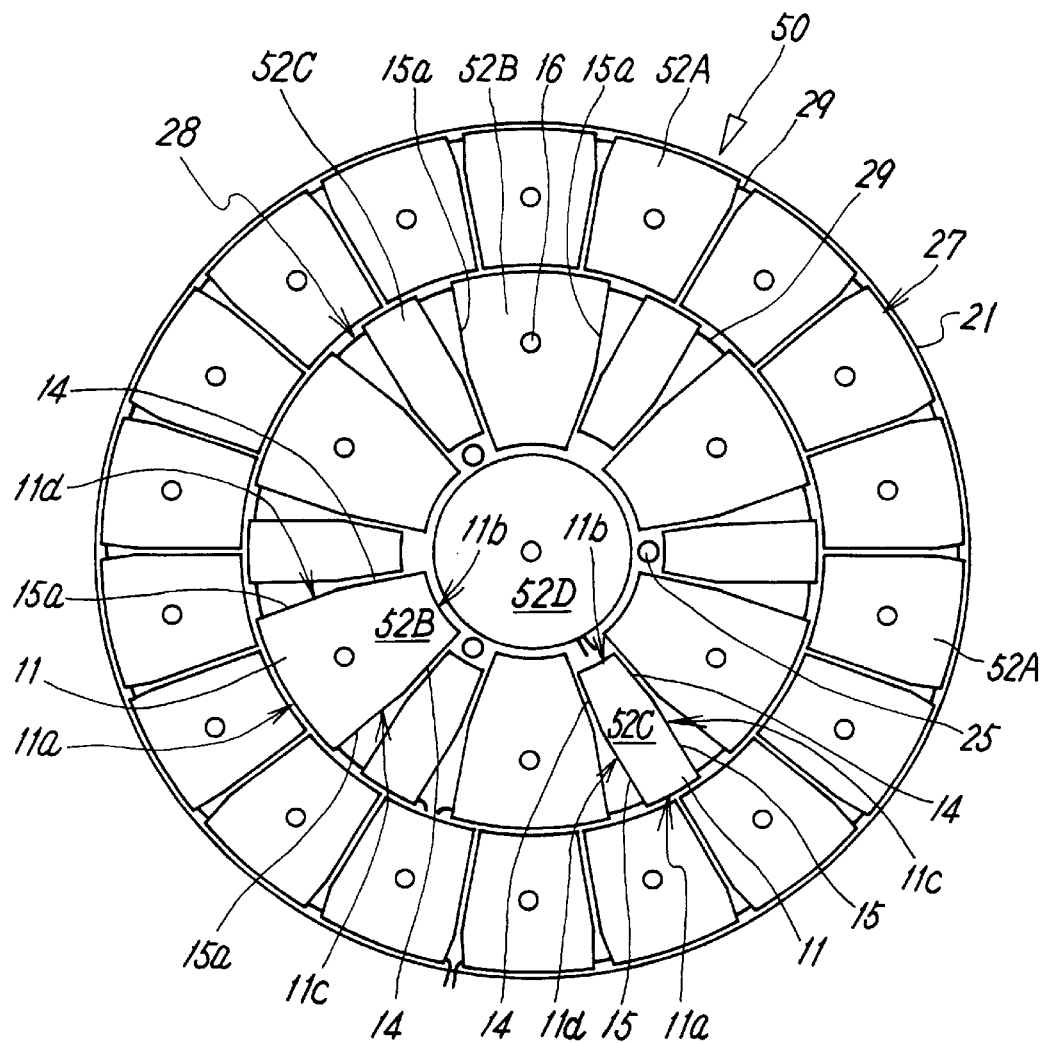
FIG. 11 is a plan view showing an example of the arrangement of the thermo module in the cooling device of the fourth embodiment.
Figure 12:
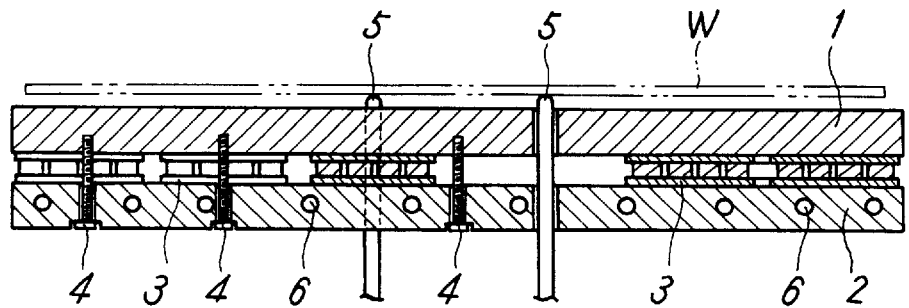
FIG. 12 is a sectional view showing schematically a conventional cooling device, taken along the line XII—XII of FIG. 13.
Figure 13:
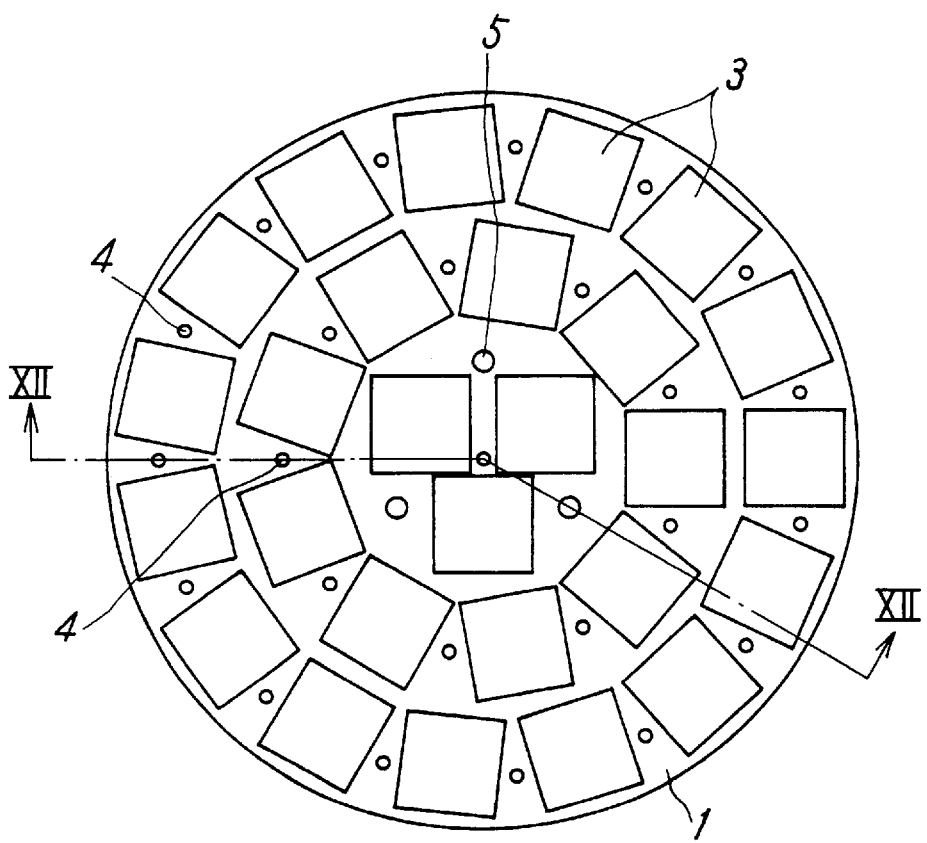
FIG. 13 is a plan view showing an arrangement of the thermo module in the cooling device of FIG. 12.

FIG. 11 shows an example of arrangement of the thermo modules in a cooling device 50 of the fourth embodiment. According to the fourth embodiment, a thermo module 52A located on an outer disc 27 is substantially the same as the thermo module 42A on an outer disc 27 of the third embodiment.

On the other hand, although two kinds of thermo modules 52B, 52C located on the inner disc 28 have the same basic structure as the thermo module 10D shown in FIG. 6, they are formed each in a different size and allocated alternately. That is, in the larger thermo module 52B, an outer peripheral contour portion 11a and an inner peripheral contour portion 11b of a heat radiating plate 11 are formed in a circular shape. Right/left side edge contour portions 11c, 11d are formed of first straight lines 14 which are located in a half portion on the side of the inner peripheral contour portion 11b and not parallel to each other and second straight lines 15a, which are located in a half portion on the side of the outer peripheral contour portion 11a and not parallel to each other. A through hole 16 is provided in the heat radiating plate 11 and a coupling screw is inserted therein. In the small thermo module 52C, the outer peripheral contour portion 11a and the inner peripheral contour portion 11b of the heat radiating plate 11 are formed in a circular shape. The right/left side edge contour portions 11c, 11d are formed of the first straight lines 14 which are located in a half portion of the inner peripheral contour portion 11b and not parallel to each other and the second straight line 15 which are located in a half portion on the side of the outer peripheral contour portion 11a and parallel to each other.

Meanwhile, a circular thermo module 22D is installed in the center of the cooling plate 21.

What is claimed is:

1. A non-rectangular thermo module formed by disposing a plurality of Peltier devices between a pair of opposing heat radiating plates, wherein said heat radiating plate has an outer peripheral contour portion and inner peripheral contour portion and right/left side edge contour portions connecting the outer peripheral contour portion and the inner peripheral contour portion and said outer peripheral contour portion are formed so as to be longer than said inner peripheral contour portion while said right/left side edge contour portions contain first straight lines which are not parallel and inclined toward said inner peripheral contour portion such that they narrow gradually, said first straight lines being provided at least in part of the right/left side edge contour portions.

2. A non-rectangular thermo module according to claim 1 wherein the right/left side edge contour portions of said heat radiating plate are formed entirely of said first straight line.

3. A non-rectangular thermo module according to claim 1 wherein the right/left side edge contour portions of said heat radiating plate are formed of said first straight lines which are located on the side of said inner peripheral contour portion and said second straight lines which are located on the side of said outer peripheral contour portion and parallel to or not parallel to each other.

4. A non-rectangular thermo module according to claim 1 wherein a plurality of said Peltier devices are disposed such that the installation density thereof has a gradient from the inner peripheral contour portion of said heat radiating plate toward the outer peripheral contour portion.

5. A non-rectangular thermo module according to claim 1 wherein the thermo module has a through hole passing through said pair of said heat radiating plates.

6. A wafer cooling device wherein a plurality of the non-rectangular thermo modules according to claim 1 are disposed coaxially between a circular cooling plate for cooling the wafer and a heat radiating block for radiating heat to outside such that said first straight lines of adjacent thermo modules are parallel and adjacent to each other.

7. A wafer cooling device according to claim 6 wherein thermo modules located on an inner disc and thermo modules located on an outer disc each have a different shape and dimensions from each other.

8. A wafer cooling device according to claim 6 wherein said cooling plate, said thermo modules and said heat radiating block are fastened to each other with screws passing through each of the thermo modules at an installation position of at least part of the thermo modules.

9. A wafer cooling device according to claim 6 wherein each of the thermo modules on the inner disc is disposed at a position in which the thermo modules located on the outer disc are adjacent to each other.

10. A wafer cooling device according to claim 6 wherein the adjacent thermo modules disposed in a circular shape are connected to each other with conductive wire successively so that the thermo modules are maintained in a necessary installation pattern by said conductive wire.

11. A non-rectangular thermo module according to claim 1, wherein said outer peripheral contour portion comprises a circular contour portion.

12. A non-rectangular thermo module according to claim 1, wherein said outer peripheral contour portion comprises a straight contour portion.

* * * * *